July 21, 1959 J. H. MYER 2,896,134

LOOP CONTACT FOR SEMICONDUCTOR

Filed Sept. 15, 1955 2 Sheets-Sheet 1

INVENTOR,
JON H. MYER

BY Henry Heyman
ATTORNEY

July 21, 1959 J. H. MYER 2,896,134

LOOP CONTACT FOR SEMICONDUCTOR

Filed Sept. 15, 1955 2 Sheets-Sheet 2

INVENTOR
JON H. MYER

BY Henry Heyman
ATTORNEY 2,896,134
Patented July 21, 1959

2,896,134

LOOP CONTACT FOR SEMICONDUCTOR

Jon H. Myer, Los Angeles, Calif., assignor to Hughes Aircraft Company, Culver City, Calif., a corporation of Delaware Application September 15, 1955, Serial No. 534,588

8 Claims. (Cl. 317—234)

This invention relates to semiconductor signal translating devices and more particularly to an improved crystal-to-electrode contact for semiconductor diodes and transistors.

Semiconductor materials, such as germanium, silicon, germanium-silicon alloys, indium-antimonide, gellium-antimonide, aluminum-antimonide, indium-arsenide, gallium-arsenide, gallium-phosphorus alloys and indium-phosphorus alloys, or others hereinafter to be discussed, have been found to be extremely useful in electrical translating devices.

Basic to the theory of operation of semiconductor devices is the concept that current may be carried in two distinctly different manners; namely, "conduction by electrons" or "excess electron conduction," and "conduction by holes," or "deficit electron conduction." The fact that electrical conductivity by both of these processes may occur simultaneously and separately in a semiconductor specimen affords a basis for explaining the electrical behavior of semiconductor devices. One manner in which the conductivity of a semiconductor specimen may be established is by the addition of "active impurities" to the base semiconductor material.

In the semiconductor art, the term "active impurity" is used to denote those impurities which affect the electrical characteristics of a semiconductor material as distinguished from other impurities which have no appreciable effect upon these characteristics. Generally, active impurities are added intentionally to the semiconductor material for producing single crystals or bodies having predetermined electrical characteristics.

Active impurities are classified as either donors, such as antimony, arsenic, bismuth, and phosphorus; or acceptors, such as indium, gallium, thallium, boron, and aluminum. A region of semiconductor material containing an excess of donor impurities and yielding an excess of free electrons is considered to be an impurity-doped N-type region. An impurity-doped P-type region is one containing an excess of acceptor impurities resulting in a deficit of electrons, or, stated differently, an excess of holes. In other words, an N-type region is one characterized by electron conductivity, whereas a P-type region is one characterized by holes conductivity.

When a continuous solid specimen such as a crystal or body of semiconductor material has an N-type region adjacent a P-type region, the boundary between the two regions is termed a P–N or N–P junction, or simply a junction.

Semiconductor diodes or transistors utilizing semiconductor crystals of any of the above-enumerated materials can be produced with stable electrical characteristics even when a small volume of air is allowed to remain in a package or envelope hermetically sealing the crystal.

These devices may have a semiconductor crystal and one or more whisker elements in point contact therewith. In the manufacture of such devices many difficulties are encountered, for example: assuring proper alignment of the point contact of the whisker element with the center of the crystal of a diode. Another problem involves the necessity for the careful application of the proper amount of pressure on the whisker element.

Another disadvantage which is typical of the point contact devices of the prior art is their inefficient heat dissipation rate requiring that they be operated at relatively low current so as not to exceed their low power dissipation figure.

Other semiconductor devices, namely, those of the junction type, also have several shortcomings. Junction devices, such as transistors or diodes, usually require the connection of one or more of their electrodes through a contact to the semiconductor crystal. Typically this connection is effected by a bonding arrangement using solder or the like, or, on the other hand, a pressure technique may be employed forcing the crystal and its associated electrode in intimate contact with one another. When the pressure contact principle is used the usual configuration for the contact is a single or double kink leaf spring. These springs have the inherent disadvantage of being non-symmetrical, thus an excess or lack of the correct amount of pressure causes them to make contact in a non-symmetrical manner. Further, the ability of spring contacts to withstand shock and/or acceleration is limited by their tendency, due to the above-described lack of symmetry toward a lateral displacement about the original point of contact with the crystal.

The present invention concerning a resilient loop contact, obviates the above difficulties by virtue of a novel construction of the contact between the crystal and its associated electrode.

Accordingly, it is an object of this invention to provide a new and novel type of contact between the crystal and electrode of a semiconductor device.

Another object of this invention is to provide a semiconductor device which will permit operation with a relatively high power dissipation.

A further object of this invention is to provide a semiconductor device wherein the crystal contact is certain to make contact with the semiconductor crystal substantially at the center of a face thereof.

A still further object of this invention is to provide a semiconductor device whose electrode-to-crystal pressure is not confined to narrow limits.

Another object of this invention is to provide a semiconductor device which will not be detrimentally affected by shock or acceleration.

According to a preferred embodiment of the present invention, a resilient loop contact consisting of a thin convex-shaped metallic ribbon, whose convexity is established with respect to the axis of its perimeter, is utilized to effect the crystal-to-electrode contact. In this embodiment, the housing and other details of construction may be the same as any known to the art, one example being the glass envelope which is described in U.S. Patent 2,694,168 entitled, "Glass-Sealed Semiconductor Crystal Device," by H. Q. North et al., issued November 9, 1954.

The radius of convexity of the ribbon is made to be coincident with the inner radius of curvature of the glass wall of the envelope so that an intimate contact therebetween may be established, thereby to allow for more efficient heat dissipation by conduction through the walls of the envelope. Further, in this embodiment, the loop contact element at the contact zone, may contain an active impurity of the opposite conductivity type from that contained in the crystal in order to establish a doped region of the opposite conductivity type in the crystal. The impurity may be deposited on the contact element or ribbon which element is made of a suitable metal, prior to its use in the semiconductor device, or it may be fused into the adjacent region of the semiconductor crystal.

Other embodiments and modifications in the design and construction of the semiconductor translating element of the present invention will be described hereinafter.

The novel features which are believed to be characteristic of the invention, both as to its organization and method of operation, together with further objects and advantages thereof, will be better understood from the following description considered in connection with the accompanying drawings in which the invention is illustrated by way of example. It is to be expressly understood, however, that the drawings are for the purpose of illustration and description only, and are not intended as a definition of the limits of the invention.

For the purposes of clarity and convenience, this invention will be primarily discussed in connection with a semiconductor diode having a resilient loop contact element in which the semiconductor crystal or specimen is N-type germanium and the loop is doped with indium as a P-type impurity. It is to be expressly understood, however, that the invention is equally applicable to transistors and also to the utilization of a P-type germanium crystal in combination with one or more resilient loop contacts doped with an N-type or P-type impurity. Further, the semiconductor material may be N- or P-type silicon-germanium alloy as opposed to germanium, or it may be any other previously mentioned semiconductor material.

Figure 1:
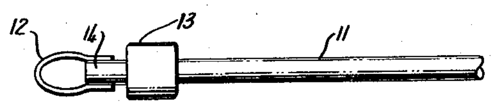
Fig. 1 is a plan view of a loop contact element connected to its associated electrode according to one embodiment of this invention.

Referring now to the drawings, wherein like reference characters designate like parts throughout the various figures, there are shown in Figs. 1 to 4 various manners in which a conductive loop contact element may be connected to its associated electrode 11. In Fig. 1 a metallic ribbon 12 is shown to be connected to the peripheral surface of electrode 11. This connection may be effected by welding or by any other method known to the art. Glass bead 13 which has been previously fused to electrode 11 is shown near the end 14 of electrode 11 to which the loop contact or ribbon 12 is connected.

Figure 2:
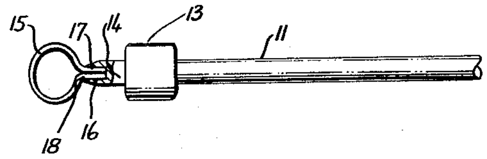
Fig. 2 is a plan view of a modification of the loop contact-to-electrode connection of a contact similar to that shown in Fig. 1.

In Fig. 2 there is shown another manner for connecting a metallic ribbon to the end 14 of electrode 11. Herein ribbon 15 is connected by inserting into slot 16 the two ends 17 and 18 of ribbon 15. This connection can then be further strengthened by compression or welding or any other method known to the art.

Figure 3:
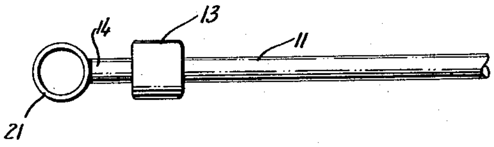
Fig. 3 is a plan view of a continuous ring type of contact illustrating another embodiment of this invention.

Referring to Fig. 3, instead of using a flat continuous metallic ribbon to form the loop a metallic ring 21 is used, which ring is fastened to the end 14 of electrode 11 in any suitable way.

Figure 4:
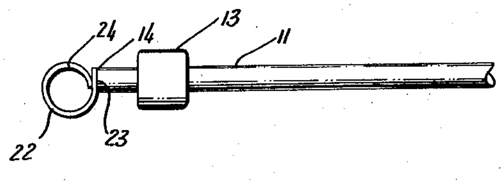
Fig. 4 is a plan view showing another construction of the loop contact of the invention to its associated electrode.

Finally, in Fig. 4 a metallic ribbon 22 is shown having one end 23 thereof fastened to the end 14 of electrode 11, the other end 24 being brought around and itself fastened to the surface of ribbon 22 opposite that surface which is connected to the end 14 of electrode 11.

Figure 5:
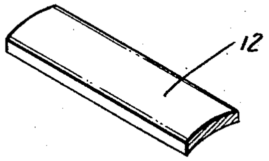
Fig. 5 is an isometric view of a section of a metallic ribbon which may be utilized to form a loop contact of the present invention as shown in Figs. 1, 2, and 4.
Figure 6:
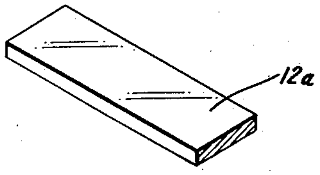
Fig. 6 is an isometric view of a section of a ribbon in modified form.

Figs. 5 and 6 illustrate two shapes which the ribbons employed in Figs. 1 through 4 may take prior to their connection to electrode 11. In Fig. 5 the ribbon 12 is shown to have a convex curvature while in Fig. 6 the ribbon **12*a*** is shown to be substantially flat. The advantage to be gained by the use of a curved ribbon as shown in Fig. 5 will be explained in connection with Fig. 7.

Figure 7:
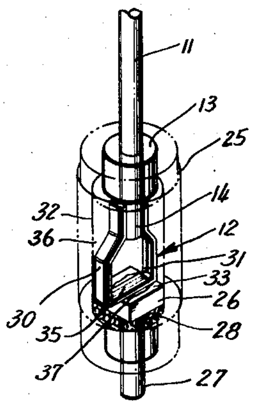
Fig. 7 is an isometric view showing a typical use of the ribbon of Fig. 5 as connected according to Fig. 1 in a semiconductor device provided with a glass envelope.

Fig. 7 shows a semiconductor device provided with a typical resilient loop contact using the ribbon of Fig. 5 and connected to electrode 11 in a manner as shown in Fig. 1. Herein envelope 25 is shown in phantom. In this figure germanium crystal 26 is shown to be bonded to electrode 27 by means of solder 28. After ribbon 12, as shown in Fig. 5 has been connected to electrode 11 in a manner typified by Fig. 1 the electrode, glass bead, and loop combination is inserted in envelope 25. Thereafter crystal 26 is placed into envelope 25 and electrode 27 brought to bear against the opposite surface of crystal 26, thus forcing ribbon or loop 12 to assume a shape as shown. It can be seen in this figure that portions 30 and 31 make contact with the inner tubular surface 36 of the void 32 in glass envelope 25.

It should be noted that vertical portions 30 and 31 of ribbon 12 are themselves oriented at right angles with respect to horizontal portion 35 which makes contact at surface 33 of crystal 26. As can be seen in Fig. 7 the contact between crystal surface 33 and horizontal ribbon portion 35 will have a rather large area.

The intimate contact between inner surface 36 of envelope 12 and portions 30 and 31 of ribbon 12 permits an increased amount of heat produced during operation in the ribbon-to-crystal contact area to be carried away by conduction through the walls of envelope 25.

The convex shape imparted to ribbon or contact 12 affords two basic advantages, namely, it allows for intimate contact between portions 30 and 31 and envelope surface 36 as well as resulting in a large area contact between ribbon section 35 and surface 33 of crystal 26. The angular and rigid shape of contact element 12 as shown in Fig. 7 is due to the stresses set up therein during the prior formation of its convex curvature when still in the shape of a ribbon as shown in Fig. 5.

Bearing in mind the previously mentioned assumption that crystal 26 is basically of N-type germanium, a region 37 of P-type conductivity may be disposed in surface 33 of crystal 26 thereof as shown in Fig. 7. P-type region 37 may be produced prior to assembly of the entire device or subsequent thereto. If the latter procedure is employed ribbon 12 may be coated or doped with a P-type active impurity such as indium, for example. After assembly, i.e., after ribbon or element 12 is brought into engagement with crystal 26, a forming current may be passed between ribbon 12 and crystal 26 by a source of voltage not shown.

The heat developed by the forming current melts a portion of the indium in element 12, which in turn melts or dissolves the region 37 of the germanium crystal 26 adjacent the contact area, thereby permitting indium atoms from the ribbon 12 to form an indium-germanium alloy which upon cooling recrystallizes to produce a strongly acceptor impurity doped P-type region 37 in N-type crystal 26, resulting in a P-N junction.

Figure 8:
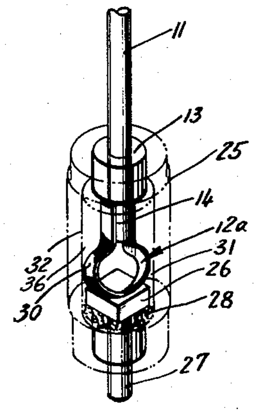
Fig. 8 is an isometric view showing how a ribbon of Fig. 6 may be connected to its associated electrode shown in Fig. 1 in a semiconductor device.

In Fig. 8 on the other hand, no convexity has been imparted to ribbon 12a, which has a shape prior to connection to electrode 11 as shown in Fig. 6. As can be seen in Fig. 8, contact surface areas between crystal 26 and contact element 12a, as well as that between ribbon portions 30 and 31 and surface 36 of envelope 25 are considerably less than that achieved in the Fig. 7 envelope.

Figure 9:
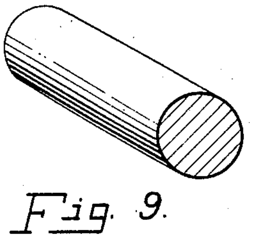
Fig. 9 is an isometric sectional view of a cylindrical wire which may alternatively be used in place of the ribbon according to Fig. 1.
Figure 10:
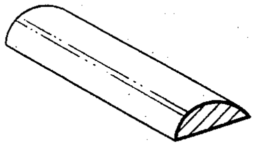
Fig. 10 is an isometric sectional view of a wire whose cross section is that of a segment of a circle and which also may be substituted for the ribbon according to Fig. 1.
Figure 11:
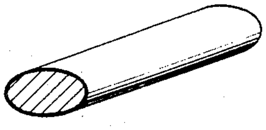
Fig. 11 is an isometric sectional view of a third alternative shape for a wire ribbon contact in place of the ribbon according to Fig. 1.

In Figs. 9, 10, and 11, alternative shapes have been shown which contact or ribbon 12 may assume, the shapes ranging from a cylindrical wire shown in Fig. 9 to a segment thereof in Fig. 10 to an elliptical cylinder as shown in Fig. 11.

Figure 12:
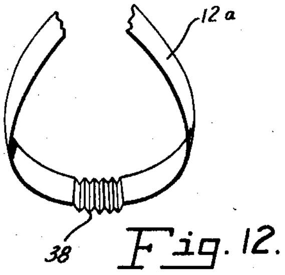
Fig. 12 shows a modification of the ribbon contact as shown in the device of Fig. 8.
Figure 13:
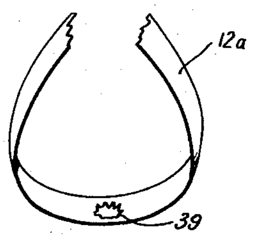
Fig. 13 is an alternative embodiment of the ribbon of Fig. 12.
Figure 14:
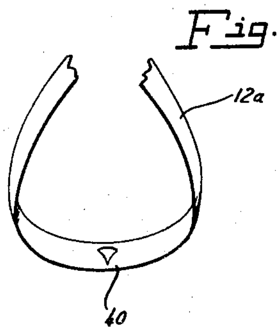
Fig. 14 is another modification of the ribbon of Fig. 12.

Figs. 12, 13, and 14 respectively show how ribbon 12a may be shaped to produce an irregular edge or edges thereupon, in order to be able to pierce the oxide layer which naturally forms on the surface of a crystal.

In Fig. 12 serrations 38 have been provided toward this end, while perforations 39 in Fig. 13 are produced for the same purpose.

Fig. 14 utilizes a dimpled point 40, thus applying the inherent advantages of the resilient loop contact of the present invention to a point contact device. The ribbons 12a of Figs. 12 through 14 have been shown flat as in Fig. 6, but it should be borne in mind that the shape of the ribbon of Fig. 5, i. e., convex shape, is equally applicable.

There has thus been described a new and novel crystal-to-electrode contact for a semiconductor device which lends itself to ease of manufacture and which inherently permits relatively large heat dissipation.

What is claimed as new is:

1. A semiconductor electrical translating device including the combination of: a body of semiconductive material of one conductivity type having in a first face thereof a region of the opposite conductivity type; a resilient loop contact element having a portion in engagement with said first face of said body at said region; a first electrical conductor connected to another portion of said loop contact element; and a second electrical conductor engaging a second face of said body.

2. A semiconductor electrical translating device including: a body of semiconductive material of one conductivity type having in a first face thereof a region of the opposite conductivity type; a resilient loop contact element having a portion engaging said first face of said body at said region, said loop contact element consisting of a thin, convex-shaped resilient metallic ribbon, the convexity of said ribbon being with respect to the axis of its perimeter; a first electrical conductor connected to another portion of said loop contact element; and a second electrical conductor in ohmic contact with a second face of said body.

3. A semiconductor electrical translating device including the combination of: a body of semiconductive material of one conductivity type; a resilient loop contact element doped with an active impurity of the opposite conductivity type from that contained in said body, and having a first portion welded to one face of said body; a first electrical conductor connected to another portion of said loop contact element disposed opposite said first portion; and a second electrical conductor engaging a second face of said body.

4. A semiconductor electrical translating device including the combination of: a semiconductive crystal of one conductivity type having a doped region of the opposite conductivity type disposed in a first face of said crystal; a loop contact element doped with an impurity of the same conductivity type as that contained in said region, and having a closed end portion welded to said first face of said crystal at said doped region; a first electrical conductor connected to another portion of said loop contact element disposed opposite said closed portion; a second electrical conductor engaging a second face of said body; a hollow vitreous substantially cylindrical envelope wholly encasing said crystal and said loop contact element and having fused hermetic seals with said first and second conductors for maintaining said conductors in their relative positions, said loop contact element consisting of a thin, convex-shaped resilient metallic ribbon, the convexity of said ribbon being with respect to the axis of its perimeter, a section of the convex surface of said ribbon intermediate said portions being in intimate contact with the inner walls of said vitreous envelope, the radius of curvature of said inner walls being substantially coincident with the radius of curvature of said ribbon at said section.

5. A semiconductor electrical translating device including the combination of: a body of semiconductive material; a resilient loop contact element engaging a portion of said body, said element having serrations therein at said portion; and an electrical conductor engaging a second portion of said body.

6. A semiconductor electrical translating device including the combination of: a body of semiconductive material; a resilient loop contact element engaging a portion of said body, said element having perforations therein at said portion; and an electrical conductor engaging a second face of said body.

7. A semiconductor electrical translating device including the combination of: a body of semiconductive material; a resilient loop contact element engaging a portion of said body, said element having a dimpled point therein at said portion; and an electrical conductor engaging a second face of said bodies.

8. A semiconductor electrical translating device including the combination of: a body of semiconductive material; a resilient loop contact element of electrically conductive material engaging a first face of said body; a first electrical conductor having a slot provided in the end thereof for receiving ends of said resilient loop contact element; and a second electrical conductor engaging a second face of said body.

References Cited in the file of this patent

UNITED STATES PATENTS

| | | |
|---|---|---|
| 1,630,383 | Haverstick | May 21, 1927 |
| 2,736,847 | Barnes | Feb. 28, 1956 |
| 2,745,044 | Lingel | May 8, 1956 |
| 2,784,300 | Zuk | Mar. 5, 1957 |

FOREIGN PATENTS

| | | |
|---|---|---|
| 305,473 | Germany | May 8, 1918 |
| 233,782 | Great Britain | May 14, 1925 |